(12) United States Patent
Kuenle et al.

(10) Patent No.: US 12,018,369 B2
(45) Date of Patent: Jun. 25, 2024

(54) SUBSTRATE PROCESSING CHAMBER AND PROCESS GAS FLOW DEFLECTOR FOR USE IN THE PROCESSING CHAMBER

(71) Applicant: Infineon Technologies AG, Neubiberg (DE)

(72) Inventors: Matthias Kuenle, Villach (AT); Olaf Fiedler, Dresden (DE); Thomas Huber, Ossiach (AT); Christian Illemann, Villach (AT); Mathias Male, Lienz (AT)

(73) Assignee: Infineon Technologies AG, Neubiberg (DE)

( * ) Notice: Subject to any disclaimer, the term of this patent is extended or adjusted under 35 U.S.C. 154(b) by 281 days.

(21) Appl. No.: 17/370,386

(22) Filed: Jul. 8, 2021

(65) Prior Publication Data

US 2022/0018023 A1    Jan. 20, 2022

(30) Foreign Application Priority Data

Jul. 14, 2020 (DE) .......................... 102020118547.2
Jun. 14, 2021 (DE) .......................... 102021115349.2

(51) Int. Cl.
*C23C 16/455* (2006.01)
*C23C 16/458* (2006.01)
*C23C 16/46* (2006.01)

(52) U.S. Cl.
CPC ...... *C23C 16/455* (2013.01); *C23C 16/45504* (2013.01); *C23C 16/45563* (2013.01); *C23C 16/45591* (2013.01); *C23C 16/4585* (2013.01); *C23C 16/46* (2013.01)

(58) Field of Classification Search
CPC ........ C23C 16/45591; C23C 16/45504; C23C 16/455; C23C 16/46; C23C 16/45563; C23C 16/4585

See application file for complete search history.

(56) References Cited

U.S. PATENT DOCUMENTS

| 4,949,669 A | 8/1990 | Ishii et al. |
| 4,976,996 A | 12/1990 | Monkowski et al. |
| 6,803,546 B1 * | 10/2004 | Boas ................. H01L 21/67109 |
| | | 118/724 |
| 6,902,622 B2 | 6/2005 | Johnsgard et al. |
| 10,047,457 B2 | 8/2018 | Shah et al. |

(Continued)

*Primary Examiner* — Aiden Lee
(74) *Attorney, Agent, or Firm* — Murphy, Bilak & Homiller, PLLC

(57) ABSTRACT

A processing chamber includes a chamber body, a substrate support configured to hold a substrate in place, and a pre-heat ring having a central opening sized to be disposed around the substrate. A process gas inlet is configured to direct process gas in a lateral direction to flow over the pre-heat ring and the substrate. A process gas flow deflector includes a radially outer mounting portion and a radially inner blade-shaped process gas deflection portion extending in a radial direction. The radially inner blade-shaped process gas deflection portion is shaped as a ring segment. The radially inner blade-shaped process gas deflection portion is disposed above the process gas inlet and dimensioned to overlap with the pre-heat ring, wherein a degree of overlap between the pre-heat ring and process gas flow deflector in the radial direction is at least ½ of the radial dimension of the pre-heat ring.

28 Claims, 6 Drawing Sheets

(56) References Cited

U.S. PATENT DOCUMENTS

| | | | |
|---|---|---|---|
| 2002/0142095 A1* | 10/2002 | Motoyama | C23C 16/45591 427/255.6 |
| 2010/0120259 A1* | 5/2010 | Vatus | C23C 16/4585 438/758 |
| 2015/0075430 A1* | 3/2015 | Shah | C30B 25/10 118/724 |
| 2015/0292088 A1* | 10/2015 | Canizares | C23C 16/45504 118/715 |
| 2016/0281263 A1* | 9/2016 | Oki | C23C 16/4581 |
| 2018/0298493 A1* | 10/2018 | Yoo | C23C 16/45563 |

* cited by examiner

«SUBSTRATE PROCESSING CHAMBER AND PROCESS GAS FLOW DEFLECTOR FOR USE IN THE PROCESSING CHAMBER»

TECHNICAL FIELD

This disclosure relates generally to the technique of substrate processing and epitaxial layer growth, and in particular to the art of controlling a process gas flow in a substrate processing chamber.

BACKGROUND

Semiconductor manufacturing involves the generation of epitaxial layers on substrates. To this end, a process gas is directed across a surface of the substrate to be processed. The performance of the later devices is greatly dependent on the degree of control of the process gas flow used for epitaxial layer growth. Along with other parameters the characteristics of the process gas flow such as, e.g., its spatial velocity distribution over the substrate have a significant influence on the distribution of layer thickness and/or doping density in the epitaxial layer formed on the substrate.

Conventional processing chambers are sometimes equipped with a pre-heat ring disposed in proximity of a process gas inlet. The pre-heat ring typically extends between a wall section of the processing chamber and the periphery of the substrate to be processed. The pre-heat ring has shown to be effective in reducing process gas flow turbulences by virtue of substantially separating the processing chamber in an upper region and a lower region and by controlling the temperature of the injected process gas on its way from the process gas inlet to the substrate.

SUMMARY

According to an aspect of the disclosure, a processing chamber for processing a substrate comprises a chamber body defining an interior substrate processing region. The processing chamber further comprises a substrate support for holding a substrate in place and a pre-heat ring having a central opening sized to be disposed around the substrate to be placed on the substrate support. A process gas inlet is configured to direct process gas in a lateral direction to flow over the pre-heat ring and over the substrate to be placed on the substrate support. A process gas outlet is arranged opposite the process gas inlet. A process gas flow deflector comprises a radially outer mounting portion and a radially inner blade-shaped process gas deflection portion extending in the radial direction, wherein the radially inner blade-shaped process gas deflection portion is shaped as a ring segment. The radially inner blade-shaped process gas deflection portion is disposed above the process gas inlet and dimensioned to overlap with the pre-heat ring, wherein a degree of overlap between the pre-heat ring and the process gas flow deflector in the radial direction is at least ½ of the radial dimension of the pre-heat ring.

According to another aspect of the disclosure, a process gas flow deflector for use in a substrate processing chamber is provided. The process gas flow deflector comprises a radially outer mounting portion and a radially inner blade-shaped process gas deflection portion. The radially inner blade-shaped process gas deflection portion is shaped as a ring segment and has a blade-shaped cross section extending from the radially outer mounting portion in the radial inner direction over a distance of equal to or greater than 15 mm or 20 mm or 25 mm.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other unless specifically noted otherwise.

As used in this specification, the terms "fixed to" or "mounted to" or similar terms are not meant to mean that the elements must directly be contacted together; intervening elements may be provided between the "fixed to" or "mounted to" elements, respectively. However, in accordance with the disclosure, the above-mentioned and similar terms may, optionally, also have the specific meaning that the elements are directly contacted together, i.e. that no intervening elements or layers are provided between the "fixed to" or "mounted to" elements, respectively.

Further, the words "over" or "beneath" with regard to a part formed or located or arranged "over" or "beneath" another part may be used herein to mean that the part be located (e.g. placed, formed, arranged, deposited, etc.) "directly on" or "directly under", e.g. in direct contact with, the implied other part. The word "over" or "beneath" used with regard to a part formed or located or arranged "over" or "beneath" another part may, however, either be used herein to mean that the part be located (e.g. placed, formed, arranged, deposited, etc.) "indirectly on" or "indirectly under" the implied part, with one or more additional parts being arranged between the implied parts.

Figure 1:
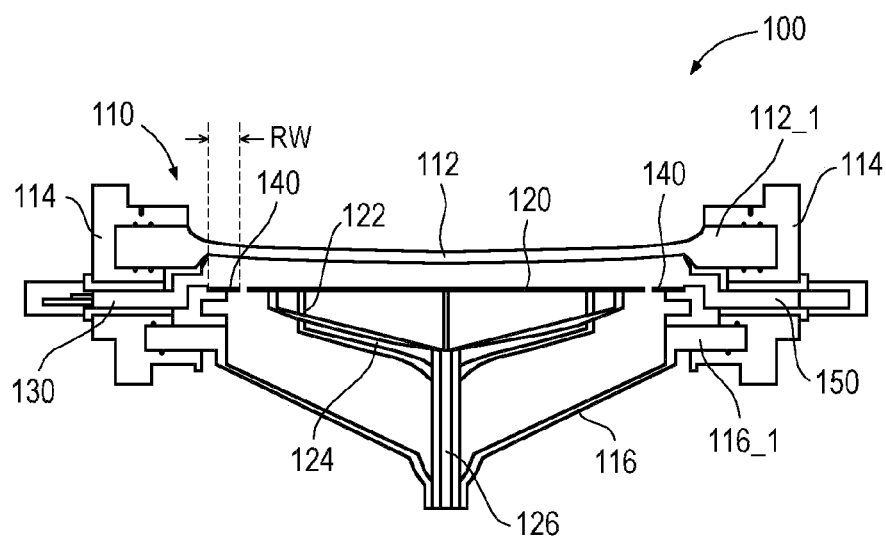
FIG. 1 is a schematic cross-sectional view of an example of a processing chamber for processing a substrate along line CL of FIG. 2.

FIG. 1 illustrates a schematic cross-sectional view of a processing chamber 100 for processing a substrate (not shown). The substrate may, e.g., be a semiconductor substrate such as, e.g., a wafer. The substrate to be processed in the processing chamber 100 may have a round shape when viewing from the top of the processing chamber 100. For instance, the processing chamber 100 may be dimensioned to process substrates having a diameter of, e.g., 200 mm or 300 mm. The position of the substrate during operation is substantially predetermined by constructional features of the processing chamber 100, as will be described in greater detail further below.

The processing chamber 100 comprises a chamber body 110 defining an interior substrate processing region. Further, the processing chamber 100 includes a substrate support 120 disposed in the interior substrate processing region. The substrate support 120 is configured for supporting the substrate. For instance, the substrate support 120 may be formed as a disc which may have a disc-shaped recess (not shown) in the upper surface acting as a susceptor for receiving and positioning the substrate. For example, the substrate support 120 may have a diameter of, e.g., 340 mm and the disc-shaped recess may have a diameter of, e.g., 302 mm.

The processing chamber 100 further includes a process gas inlet 130. The process gas inlet 130 is configured to direct process gas in a lateral direction to flow over a pre-heat ring 140 and over the substrate. The pre-heat ring 140 has a central opening sized to be disposed around the substrate support 120.

The substrate support 120 may be supported by support posts 122, which are connected to support arms 124. The support arms 124 may be mounted on a rotatable shaft 126. The substrate support 120 may be movable in the vertical direction to raise and lower the substrate and/or may be configured to rotate the substrate at a controllable speed. The substrate support 120 may be a support on which the substrate, when placed on the substrate support 120, is supported via point contacts provided, e.g., by the support posts 122, or it may be a disc-like substrate support (as shown in this example) or a ring-like substrate support which supports the substrate over its entire area or at an edge region of the substrate, respectively.

The chamber body 110 may include an upper dome 112, a sidewall 114 and a lower dome 116. The substrate support 120 is disposed within the interior substrate processing region defined by, e.g., the upper dome 112, the lower dome 116 and the sidewall 114 connecting the upper dome 112 to the lower dome 116. For instance, the upper dome 112 and the lower dome 116 are equipped with circumferential flanges 112_1 and 116_1, respectively, which are configured to be mounted to a base ring which represents the sidewall 114 of the chamber body 110.

The upper dome 112, the lower dome 116 and the sidewall 114 may all have a generally circular shape. However, it is also possible that the shape of these components is not circular but, e.g., includes the shape of a rectangle, polygon, oval, or the like.

The upper dome 112 and/or the lower dome 116 may comprise or be formed from an optically transparent material such as quartz, to facilitate the passage of thermal radiation therethrough. To this end, radiant heating lamps (not shown) may be positioned above and/or below the chamber body 110. The radiant heating lamps may illuminate the interior substrate processing region and, in particular, the substrate when placed on the substrate support 120 during operation. Further, the radiant heating lamps may illuminate the pre-heat ring 140 and, e.g., other portions of the interior substrate processing region in order to provide for a controlled temperature environment of the substrate. The radiant heating lamps may emit a heat radiation (thermal radiation) in the wavelength range of 350 nm to 3000 nm.

It is also possible to use heating sources other than radiant heating lamps. For instance, an induction heating source (not shown) could be provided.

The pre-heat ring 140 may be dimensioned to have a ring width RW in the radial dimension in a range from 20 mm to 50 mm or 25 mm to 45 mm or 30 mm to 40 mm, or other combinations of these range limits. In particular, the ring width may be about 35 mm.

The pre-heat ring 140 may be formed from any material suitable to absorb energy from thermal radiation, e.g. thermal radiation provided by the aforementioned radiant heating lamps (not shown). The pre-heat ring 140 may, e.g., be made from quartz, silicon carbide, graphite coated with silicon carbide, opaque quartz, coated quartz, or any similar material. The material of which the pre-heat ring 140 is made should also be resistant to chemical and thermal impact by the process gases as used during operation.

The inner circumference of the pre-heat ring 140 may be sized to be separated from a periphery of the substrate support 120 by a small (circular) gap. The gap may, e.g., be between 0.1 mm and 0.8 mm in the radial direction. As will be described further below, the process gas flow is directed in a lateral direction to traverse this gap and hence, the gap should be dimensioned as small as not to introduce turbulences into the traversing process gas flow.

Further, the pre-heat ring 140 may be at about the same elevation as the substrate when placed on the substrate support 120. Stated differently, an upper surface of the substrate and an upper surface of the pre-heat ring 140 may be on approximately or exactly the same level in the interior substrate processing region.

During operation the pre-heat ring 140 provides for a substantial separation of an upper region in the processing chamber (defined by the upper dome 112, an upper part of the sidewall 114 and the pre-heat ring 140 together with the substrate) and a lower region of the processing chamber 100 (defined by the lower dome 116, a part of the sidewall 114 and the pre-heat ring 140 together with the substrate). This separation affects the process gas flow in the interior substrate processing region. Further, the pre-heat ring 140 controls the temperature or temperature gradient in the upper region (and, e.g., also in the lower region) of the processing chamber 100.

More specifically, during processing the pre-heat ring 140 may be heated to a temperature which is only little lower than the temperature of the substrate. That way, a temperature gradient between the substrate and its environment is reduced by the pre-heat ring 140. Further, the heated pre-heat ring 140 heats and may activate the process gas as the process gas flows in a radial direction through the process gas inlet 130 over the pre-heat ring 140 to the substrate.

The processing chamber 100 further includes a process gas outlet 150 which may, e.g., be arranged opposite the process gas inlet 130. The process gas inlet 130, the pre-heat ring 140, the substrate support 120, the substrate and the process gas outlet 150 may, e.g., be at about the same level during processing.

Figure 2:
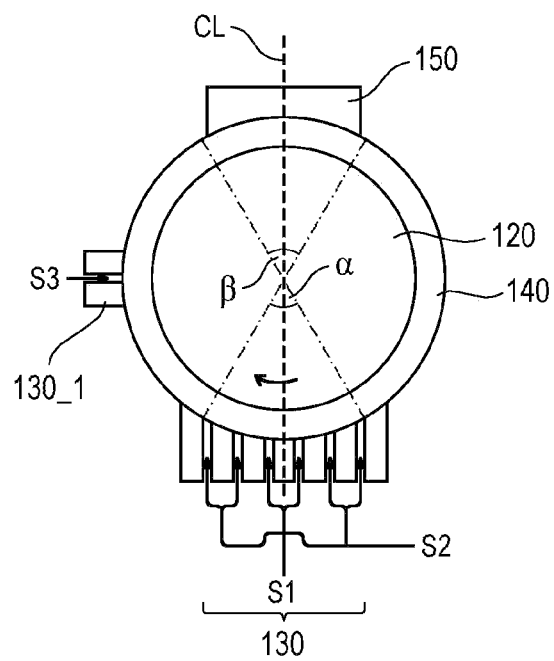
FIG. 2 is a schematic top view of an opened processing chamber illustrating an exemplary arrangement of processing gas inlets and a process gas outlet.

Referring to FIG. 2, the process gas inlet 130 may, e.g., include a plurality of laterally spaced apart gas inlet channels for delivering a plurality of individual gas flows. The plurality of gas inlet channels may be configured to provide individual gas flows with different characteristics such as, e.g., gas flow velocity and/or process gas composition and/or process gas concentration. Further, the individual gas flow inlet channels may be grouped as outer inlet channels and inner inlets as shown in FIG. 2. For example, a group of inner inlets channels of the process gas inlet 130 may be connected to a first process gas source S1 and two groups of outer inlet channels may be connected to a second process gas source S2, wherein the process gas delivered by the inner group of gas inlet channels may have another gas flow velocity and/or concentration and/or composition than the process gas delivered by the two outer groups of gas inlet channels of the process gas inlet 130. In FIG. 2, CL denotes the radial center line of the gas inlet 130.

The process gas inlet 130 extends along a portion of the circumferential dimension of the processing chamber 100. This circumferential portion may, e.g., extend in a circumferential direction over an angular range a of equal to or greater than 70° or 90° or 110° or 130°. The circumferential portion may, e.g., have a width similar to a diameter of the substrate. The distributed arrangement of the process gas inlet 130 may serve to provide for a laminar process gas flow which substantially covers a major part or the entire part the substrate during processing.

The process gas outlet 150 may likewise extend along a portion of the circumferential dimension of the processing chamber 100. This circumferential portion may, e.g., extend in a circumferential direction over an angular range R. The angular range β may, e.g., be equal to or greater than 70° or 90° or 110° or 130°. The angular range β may, e.g., be of similar size than the angular range α. In the processing chamber 100 used herein, the angles α and β were both about 90°. The process gas outlet 150 may, e.g., be implemented by a single opening having the aforementioned circumferential extension.

Additionally, there may be a side process gas inlet 130_1 configured to deliver an auxiliary process gas flow (also termed X-flow in the art) to the substrate. The auxiliary process gas flow may be provided by the first process gas source S1 or the second process gas source S2 or another process gas source S3 different from S1 and S2. The side process gas inlet 130_1 may be located under an angle of equal to or greater than or less than 90° or 95° or 100° between the center line CL and a line connecting the side process gas inlet 130_1 and the center of the processing chamber 100, wherein the angle is measured in the direction of rotation of the substrate (see arrow). In the processing chamber 100 used herein, this angle was about 95°.

The side process gas inlet 130_1 may be oriented in a radial direction as shown in FIG. 2. In other examples, the side process gas inlet 130_1 may be oriented inclined to the radial direction, with an inclination angle of e.g. in a range between 0° (corresponding to the radial direction) and 30° or 60° in the direction of rotation of the substrate.

The processing chamber 100 described above corresponds to Applied Materials (AMAT) Epi Centura equipment. All experimental data and simulation results, as well as the dimensioning of the various parts disclosed herein, refer to this equipment as an example. It is understood, however, that the Applied Materials (AMAT) Epi Centura equipment is a purely exemplary selection and the disclosures herein, particularly with respect to the process gas flow deflector described in more detail below, are of general applicability.

The adjustment of the process gas composition and/or concentration and/or gas flow velocity distribution across the substrate may be varied. The variation of one or more of these parameters may be the main influencing parameters for tuning the uniformity and thickness distribution of the semiconductor layer and/or the concentration of a dopant in the semiconductor layer formed over the substrate. Further, the uniformity and thickness distribution of the semiconductor layer as well as the dopant concentration in the semiconductor layer may, e.g., be dependent to a lesser extent from the temperature distribution, the rotational speed and the elevation of the substrate during processing. As will be described in more detail further below, the thickness distribution of the semiconductor layer further is strongly dependent from the circumferential extension and design of the process gas flow deflector.

One of the major goals during semiconductor layer generation (i.e. epitaxial growth of the semiconductor layer) is to increase the uniformity of the layer thickness distribution and the reproducibility of the obtained uniformity of the layer thickness distribution during processing. Further, it may be desired to increase the uniformity of the distribution of the dopant concentration in the semiconductor layer. These two properties (layer thickness distribution and dopant concentration distribution) are known to affect important parameters of later semiconductor devices such as the drain-source breakdown voltage $BV_{DSS}$ and the on-resistance $R_{on}$ of transistors.

More specifically, semiconductor technology aims to reduce the product of $R_{on}$ times the semiconductor area. This product may be reduced, inter alia, by decreasing the thickness of the semiconductor layer and/or by decreasing the specific resistance of the semiconductor layer. However, the optimization of $R_{on}$ based on these two parameters is limited by the occurrence of repetitive avalanches and the occurrence of a rapid drop of the drain-source breakdown voltage $BV_{DSS}$ with decreasing layer thickness.

An enhanced reproducibility of the semiconductor layer allows obtaining smaller tolerances in terms of layer thickness and electrical resistance. As a consequence, the device in terms of layer thickness and electrical resistance can be designed closer to the rapid drop of the drain-source breakdown voltage $BV_{DSS}$ and hence, a lower on-resistance $R_{on}$ may be obtained.

The processing chamber 100 may be used to generate epitaxial semiconductor layers of a thickness up to, e.g., 20 µm on the substrate. For a layer thickness of equal to or greater than about 1 µm, a process denoted as APCVD (atmospheric pressure chemical vapor deposition) may be used in a temperature range from about 1050° C. to 1180° C. For instance, in the process gas TCS (trichlorosilane) may be used as a deposited layer source gas in combination with, e.g., $H_2$ (hydrogen) as a carrier gas. A variety of different dopants may be added to the process gas. For instance $B_2H_6$ (diborane) may be added for p-type doping and/or $PH_3$ (phosphine) may be added for n-type doping.

As known in the art, the layer thickness may either be controlled by the temperature or by the process gas flow and/or process gas distribution in the processing chamber 100. If the temperature is smaller than 900° C., the temperature distribution across the substrate determines the layer thickness. For higher temperatures, e.g. equal to or greater than 1100° C., the layer thickness over the substrate is mainly determined by the process gas flow characteristics. In this temperature regime, TCS is thermally decomposed into different species, with $SiCl_2$ representing the main layer-forming species. Then, the deposition rate mainly depends on the distribution of the partial pressure of the process gas and the total amount of layer-forming molecules (e.g. $SiCl_2$) which diffuse via a laminar interfacial layer to the surface of the substrate.

The process gas flow, the distribution of the flow velocity over the substrate and the distribution of the composition of the process gas over the substrate may to some extent be adjusted by a main flow control system (not shown) used to feed the process gas inlet 130 and optionally the side process gas inlet 130_1.

According to the disclosure, a process gas flow deflector (not shown in FIG. 1) is disposed over the process gas inlet 130 and is dimensioned to overlap with the pre-heat ring 140 in the radial direction. The process gas flow deflector overlaps with the pre-heat ring 140 to a degree which is at least ½ of the radial dimension of the pre-heat ring 140.

Figure 3A:
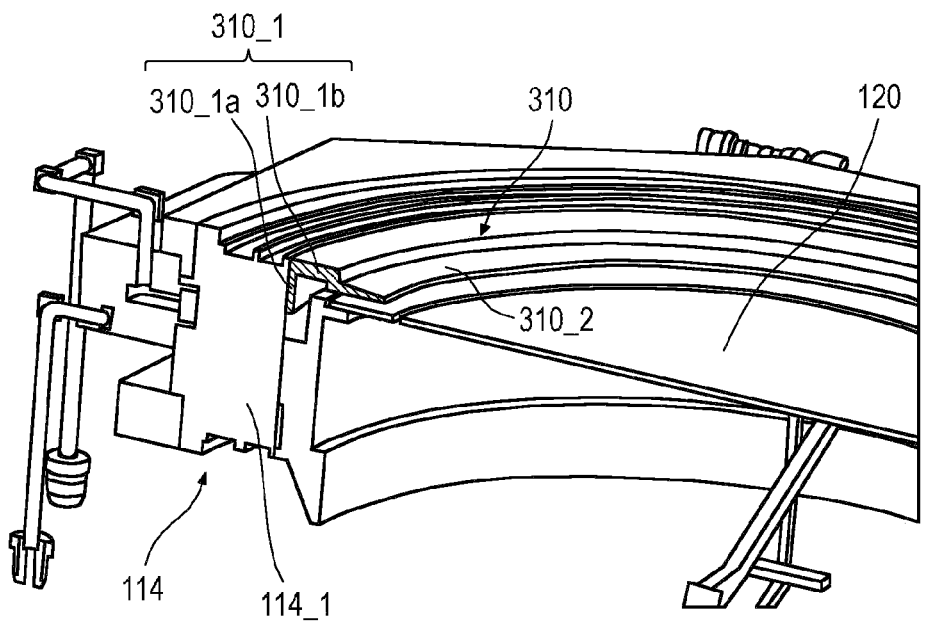
FIG. 3A is a partial perspective cross-sectional view of a first embodiment of a process gas flow deflector installed in a processing chamber along line CL of FIG. 2.
Figure 3B:
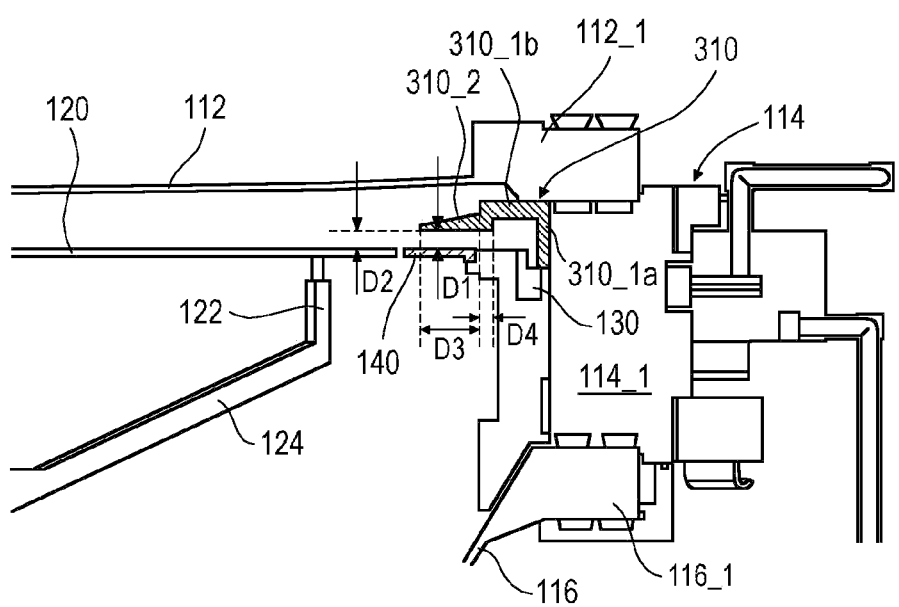
FIG. 3B is a partial cross-sectional view of the process gas flow deflector of FIG. 3A as installed in the processing chamber along line CL of FIG. 2.
Figure 4:
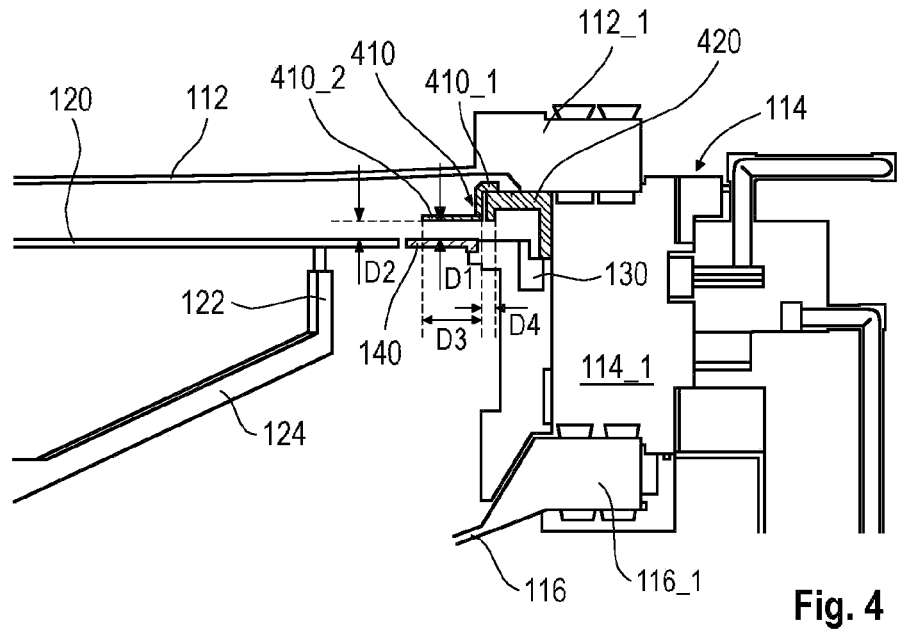
FIG. 4 is a partial cross-sectional view of a second embodiment of a process gas flow deflector installed in a processing chamber along line CL of FIG. 2.

Various examples of a gas flow deflector are shown in FIGS. 3A, 3B and 4. According to FIGS. 3A and 3B, a process gas flow deflector 310 is shaped as a ring or a ring segment or a plurality of ring segments. The ring or ring segment(s) may, e.g., at least cover the circumferential extension of the process gas inlet 130. The gas flow deflector 310 may be shaped as a closed ring which completely surrounds the processing chamber 100 at an inner periphery of the sidewall 114. As will be described in more detail further below (FIGS. 9A, 9B), a radially inner blade-shaped process gas deflection portion 310_2 of the gas flow deflector 310 is shaped as a ring segment which completely overlays the process gas inlet 130 and extends in the circumferential direction to end in a cutout at the process gas outlet 150. The cutout may be sized to overlay (i.e. expose in a vertical projection) at least the entire circumferential extension of the process gas outlet 150.

As shown in FIG. 3B, a distance D1 in a vertical direction between the process gas flow deflector 310 (or, more specifically, the inner blade-shaped process gas deflection portion 310_2 thereof) and the pre-heat ring 140 may be equal to or less than 20 mm or 15 mm or 12 mm or 10 mm in circumferential proximity to the process gas inlet 130 or, e.g., along the entire circumferential dimension of the pre-heat ring 140 and the inner blade-shaped process gas deflection portion 310_2 of the process gas flow deflector 310. In other words, D1 is a clearance between the pre-heat ring 140 and the process gas flow deflector 310 (or, more specifically, the inner blade-shaped process gas deflection portion 310_2 thereof) through which the process gas flow is passed through on its way to the substrate. D2 is a distance in a vertical direction between the process gas flow deflector 310 (or, more specifically, the inner blade-shaped process gas deflection portion 310_2 thereof) and the substrate when placed on the substrate support 120 during processing. D1 is also measured in circumferential proximity to the process gas inlet 130 and may, e.g., be constant along the entire circumferential dimension of the inner blade-shaped process gas deflection portion 310_2 of the process gas flow deflector 310. D1 and D2 may be substantially equal (i.e. the upper surface of the substrate may level with the upper surface of the pre-heat ring 140) or may differ from each other by a few mm or less.

The overlap between the pre-heat ring 140 and the process gas flow deflector 310 (or, more specifically, the inner blade-shaped process gas deflection portion 310_2 thereof) in the radial direction may, e.g., be equal to or greater than 15 mm or 20 mm or 25 mm.

The overlap between the process gas flow deflector 310 and the pre-heat ring 140 together with an appropriate distance D1 in vertical direction between these elements has shown to provide for improved process gas flow characteristics over the substrate. In particular, as will be described in more detail further below, a more uniform flow velocity distribution over the substrate may be obtained. As a result, the layer thickness uniformity and, e.g. other layer parameters as mentioned above can be improved.

As will be described in more detail further below, the process gas flow deflector 310 causes the process gas flow and the distribution of the gas flow velocity across the substrate to be more uniform compared to a situation in which no process gas flow deflector 310 is installed in the processing chamber 100 (as shown, e.g., in FIG. 1). Further, the laminar process gas flow over the substrate is less turbulent when the process gas flow deflector 310 is installed. These effects cause a more homogeneous deposition rate distribution over the substrate and hence an improved uniformity of the layer thickness.

As illustrated in FIGS. 3A and 3B, the process gas flow deflector 310 may be shaped as a ring or one or multiple ring segments which include a radially outer mounting portion 310_1 and a radially inner blade-shaped process gas deflection portion 310_2 extending in the radial direction. The process gas deflection portion 310_2 may have a width D3 equal to or greater than 15 mm or 20 mm or 25 mm or 30 mm. In the example illustrated in FIGS. 3A and 3B, D3=27 mm. Further, in this example, D1=8.35 mm. D2 may be similar to D1, e.g. D2 may be set to D2=D1=8.35 mm in this example. The distance D4 may, e.g., be equal to 11 mm in accordance with the illustrated example. As will be described in more detail further below, at least the radially inner blade-shaped process gas deflection portion 310_2 is shaped as a ring segment rather than a closed ring.

The radially outer mounting portion 310_1 may have any suitable shape for fixing the process gas flow deflector 310 to the sidewall 114 of the chamber body 110. For instance, the mounting portion 310_1 may include a radially outer vertical section 310 1a and a radially inner horizontal section 310_1b. The mounting portion 310_1 may have a shape similar or identical to a wall element (see FIG. 4, wall element 420) which is known as a liner in the art. The process gas flow deflector 310 may be made of one piece, i.e. the radially outer mounting portion 310_1 and the radially inner blade-shaped process gas deflection portion 310_2 may be integrally formed with the process gas flow deflector 310.

The process gas flow deflector 310 may be sized to abut against a sidewall ring 114_1 forming part of the sidewall 114. The sidewall ring 114_1 (also denoted as base ring in the art) may include a duct system connected with the process gas inlet 130. The sidewall ring 114_1 may be disposed below the flange 112_1 of the upper dome 112. The mounting portion 310_1 may be configured to adjoin both the flange 112_1 of the upper dome 112 and the sidewall ring 114_1 of the sidewall 114. More specifically, the vertical section 310_1a may abut against the sidewall ring 114_1 and/or the horizontal section 310_1b may abut against the flange 112_1.

FIG. 3B is drawn to scale, i.e. sizes of individual parts or sections of a part and/or relations of sizes (such as smaller than or greater than) can directly be derived from FIG. 3B and generalized without restriction to the specific embodiment of FIG. 3B within the scope of this disclosure.

FIG. 4 illustrates another example of a process gas flow deflector 410. The process gas flow deflector 410 distinguishes from the process gas flow deflector 310 in that it includes a radially outer mounting portion 410_1 configured to be hooked to a wall element 420 of the chamber body 110. The wall element 420 may, e.g., be permanently installed in or fixed to the sidewall 114, e.g. the sidewall ring 114_1. The wall element 420 is sometimes also referred to as a liner in the art.

The radially inner blade-shaped process gas deflection portion 410_2 may have the same shape as the radially inner blade-shaped process gas deflection portion 310_2, and reference is made to the above description in order to avoid reiteration. The radially inner blade-shaped process gas deflection portion 410_2 is shaped as a ring segment rather than a closed ring. Further, the dimensions, locations and/or positions of the blade-shaped process gas deflection portions 310_2 and 410_2 may be identical. FIG. 4 is drawn to scale, i.e. sizes of individual parts or sections of a part and/or relations of sizes (such as smaller than or greater than) can directly be derived from FIG. 4 and generalized without restriction to the specific embodiment of FIG. 4 within the scope of this disclosure.

As apparent from FIG. 4, the process gas flow deflector 410 may simply be detached from the opened processing chamber 100 by lifting the process gas flow deflector 410 and removing it from the processing chamber 100. This may facilitate the maintenance or the exchange of the process gas flow deflector 410.

As apparent from the true-scale drawings of FIGS. 3B and 4, the width D3 of the blade-shaped process gas deflection portion 310_2, 410_2 in proximity to the process gas inlet 130 may approximately correspond to the overlap between the pre-heat ring 140 and the process gas flow deflector 310, 410 in the radial direction. Therefore, when referring to absolute values, the degree of overlap between the pre-heat ring 140 and the process gas flow deflector 310, 410 in the radial direction may translate into an overlap distance of, e.g., equal to or greater than 15 mm or 20 mm or 25 mm or 30 mm. By way of example, in FIGS. 3B and 4 the pre-heat ring 140 is dimensioned to have a ring width of 35 mm (see ring width RW of FIG. 1) and the overlap between the pre-heat ring 140 and the process gas flow deflector 310, 410 in the radial direction is close to the exemplary D3 dimension of 27 mm.

The overall distance D3+D4 is the length along which the process gas flow is channelized by the process gas flow deflector 310 in FIGS. 3A and 3B and by the combination of the wall element 420 and the process gas flow deflector 410 in FIG. 4. Hence, in general, an overall channelization length D3+D4 caused by the process gas flow deflector 310, 410 extending from a channelization inlet (e.g. of vertical dimension D1) to a channelization outlet (e.g. of vertical dimension D1) may, e.g., be equal to or greater than 26 mm or 31 mm or 36 mm.

The process gas flow deflector 310, 410 or at least the blade-shaped process gas deflection portion 310_2, 410_2 thereof may be transparent for heat radiation and may, e.g., also be optically transparent. For instance, a heat radiation transparency of more than e.g. 95% or 99% may be used. The heat radiation transparency allows to heat the pre-heat ring 140 by heat radiation from radiant heating lamps (not shown) arranged over the upper dome 112 of the chamber body 110. For instance, the process gas flow deflector 310, 410 may be formed from quartz. However, it is also possible to use a material for the process gas flow deflector 310, 410 or at least the blade-shaped process gas deflection portion 310_2, 410_2 thereof which is non-transparent for heat radiation and/or is optically non-transparent. In this case, the process gas flow deflector 310, 410 or at least the blade-shaped process gas deflection portion 310_2, 410_2 thereof may, e.g., comprise or be made of graphite having, e.g., a SiC coating, or may be made of polycrystalline SiC. For instance, induction heating may then be used for appropriately heating the pre-heat ring 140.

The temperature of the process gas flow deflector 310, 410 during operation may, e.g., be lower than the temperature of the pre-heat ring 140 by, e.g., about 100° C. or 200° C. or more. For instance, if a temperature of 1050° C. to 1180° C. is used in the processing region of the processing chamber 100 (i.e. at the substrate), the temperature of the process gas flow deflector 310, 410 may, e.g., range from 450° C. to 650° C. and may, e.g., be about 540° C.

Throughout the description the terms "ring" and "ring segment" are used to describe certain parts of the processing chamber 100 such as, e.g., the process gas flow deflector 310, 410 or the pre-heat ring 140. The shape of these parts needs not to be circular but may, e.g., include a polygonal shape or an oval shape or the like. Further, although the processing chamber 100 is described to accommodate only one single substrate, it is contemplated that the processing chamber 100 may, e.g., also accommodate a plurality of substrates arranged as a substrate stack.

Figure 5A:
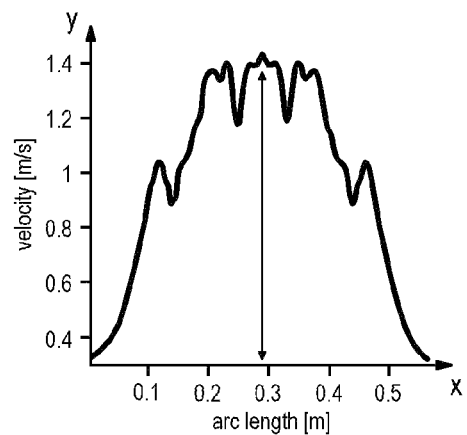
FIGS. 5A and 5B are diagrams illustrating simulation results on the gas flow velocity across the substrate without using a process gas flow deflector (FIG. 5A) in the processing chamber and with using a process gas flow deflector (FIG. 5B) in the processing chamber.

FIG. 5A illustrates simulation results on process gas flow velocity at the entrance to the processing chamber along the spatially distributed process gas inlet 130 without using a process gas flow deflector as disclosed herein. Referring to FIG. 2, the X-axis denotes the circumferential distance from a location at the right side of the process gas inlet 130 (at 0.0 m) to a location at the left side of the process gas inlet 130 (at about 0.6 m). The process gas flow velocity strongly (i.e. by a factor of about 5) varies along the process gas inlet 130, starting at a relatively low velocity in the vicinity of the right side of the process gas inlet 130, reaching a peak velocity (see the arrow) at about the center of the process gas inlet 130 (i.e. at center line CL) and decreasing in the vicinity of the left side of the process gas inlet 130.

Figure 5B:
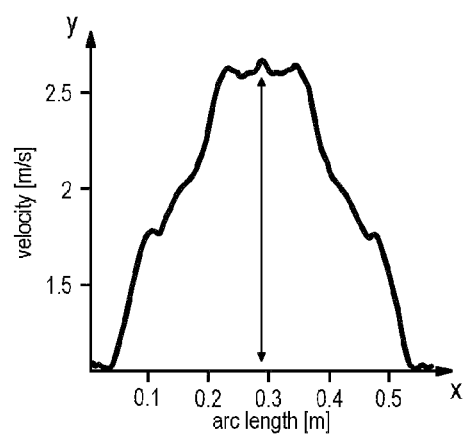

In FIG. 5B the same simulation was done with the exception that a process gas flow deflector 310 as illustrated in FIG. 3A, 3B with a blade-shaped process gas deflection portion 310_2 shaped as a closed ring was introduced into the processing chamber 100. As apparent from FIG. 5B, the gas flow velocity along the process gas inlet 130 is substantially higher than in FIG. 5A. Further, the velocity profile only varies by a factor of less than 3, i.e. is substantially more uniform in the spatial dimension than without process gas flow deflector as shown in FIG. 5A (compare the arrows in FIG. 5B and FIG. 5A).

The underlying cause for this more uniform process gas velocity is a drop in gas pressure from the process gas inlet 130 to the processing region in the processing chamber 100. This drop in pressure is caused by the process gas flow deflector 310, 410 positioned above the process gas inlet 130. The drop in pressure depends on the width D3 of the blade-shaped process gas deflection portion 310_2, 410_2 (which may approximately or exactly correspond to the overlap with the pre-heat ring 140) and on the height D1 of the blade-shaped process gas deflection portion 310_2, 410_2 over the pre-heat ring 140.

It is to be noted that this effect is not only confined to a peripheral region of the substrate but in particular shows up near the center of the substrate. Hence, the epitaxial layer formation uniformity over the entire substrate (wafer) is improved. By using the process gas flow deflector 310, 410 it could be shown that the half-range uniformity of an epitaxial layer formed over the substrate could be substantially reduced by 30% of the original value. The half-range uniformity of a layer deposited on the substrate is defined by the ratio of the obtained thickness range (i.e. the maximum layer thickness minus the minimum layer thickness over the substrate) and two times the mean of the layer thickness over the substrate. All the results disclosed herein were obtained on the basis of a standard 300 mm processing chamber 100 with and without the use of a process flow deflector 310, 410.

The cross-sectional shape of the process gas flow deflector 310, 410 or the inner blade-shaped process gas deflection portions 310_2, 410_2 thereof may be constant or may vary along the circumferential extension of the ring or ring segment(s) representing the process gas flow deflector 310, 410. In particular, the cross-sectional shape thereof may be constant along the circumferential extension of a portion of the ring or ring segment(s) which overlays the spatially distributed process gas inlet 130. The values of the distances D1, D2 and/or D3 may relate to a cross section defined by the radial center line CL of the spatially distributed process gas inlet 130 shown in FIG. 2.

Figure 6:
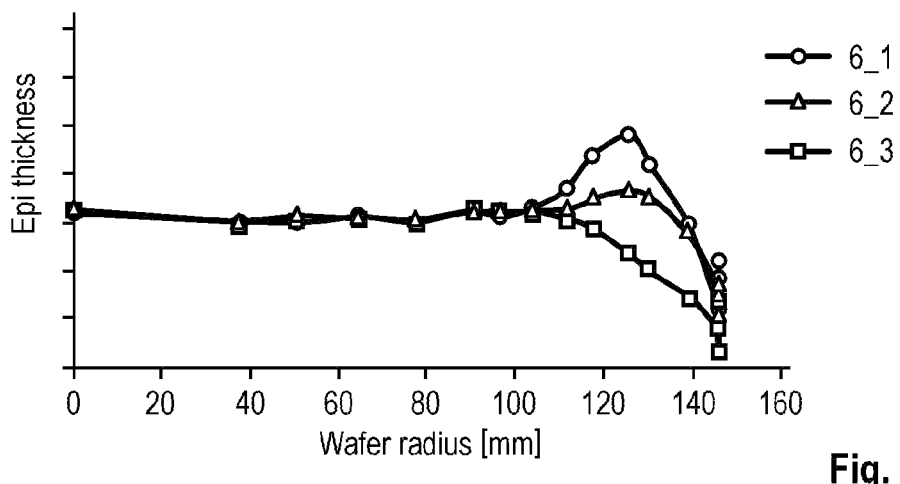
FIG. 6 is a diagram illustrating the radial thickness distribution (i.e. layer thickness in arbitrary units versus wafer radius in mm) of epitaxial layers formed on the substrate by using a circumferentially closed (360°) blade-shaped process gas deflector, with different process parameters concerning process gas and carrier gas flow rates.

The experimental results confirmed that the process gas flow deflector by homogenization of gas velocity and gas distribution as well as a reduction in horizontal and vertical turbulences, allowed to achieve an improvement in the deposition rate homogeneity and thereby in the thickness distribution of the epitaxial layer on the wafer. FIG. 6 illustrates the measured radial thickness distribution of epitaxial layers deposited on the substrate by using a circumferentially closed (360°) blade-shaped process gas deflector with different process parameters. More specifically, the curves 6_1, . . . , 6_3 correspond to the following process parameters:

curve 6_1: X-flow, flow rate=100%
curve 6_2: X-flow, flow rate=89%
curve 6_3: X-flow, flow rate=86%.

Main flow is a gas flow of a mixture of approximately 25% process gas (i.e. TCS precursor gas) and 75% $H_2$ introduced at the process gas inlet 130. Carrier gas flow is a pure $H_2$ flow additionally introduced at the process gas inlet 130. X-flow is a gas flow of a mixture of 25% process gas (i.e. TCS precursor gas) and 75% $H_2$ introduced at the side process gas inlet 130_1 (so-called X-flow inlet).

The above and further experimental results have shown that a design with a circumferential (360°) process gas flow deflector ring in the processing chamber (above the pre-heat ring as described above) leads to a thickness decrease in the edge region of the wafer, see FIG. 6. In a standard processing chamber without a process gas flow deflector ring, the thickness in the edge region of the wafer can be readjusted, for example by increasing the TCS precursor gas quantity at the side process gas inlet 130_1 (X-flow). However, in the modified processing chamber with a circumferential (360°) process gas flow deflector ring, it was not possible to increase the thickness in the edge region of the wafer even with modified process parameters (FIG. 6). Rather, as shown in FIG. 6, the radial thickness distribution in a processing chamber with a circumferential (360°) process gas flow deflector ring dropped significantly from a radius of approximately 115 mm irrespective of the process parameters used.

Further experimental results revealed that the decrease in thickness in the edge region of the wafer can be attributed to the development of turbulences or to a disruption in the laminar flow in the region of the exhaust (i.e. the process gas outlet 150).

To avoid this, it was found that a recess or cutout in the process gas flow deflector ring above the process gas outlet 150 appeared to be beneficial, and more specifically, this was found the only way to achieve an improvement in uniformity with respect to the adverse edge thickness reduction effect.

Differently put, it was found that by recessing the flow deflector ring above the process gas outlet 150, the thickness in the edge area of the wafer can be adjusted with different process parameters (e.g. TCS quantity at the X-flow, height of substrate support 120 (e.g. susceptor), etc.).

Figure 7:
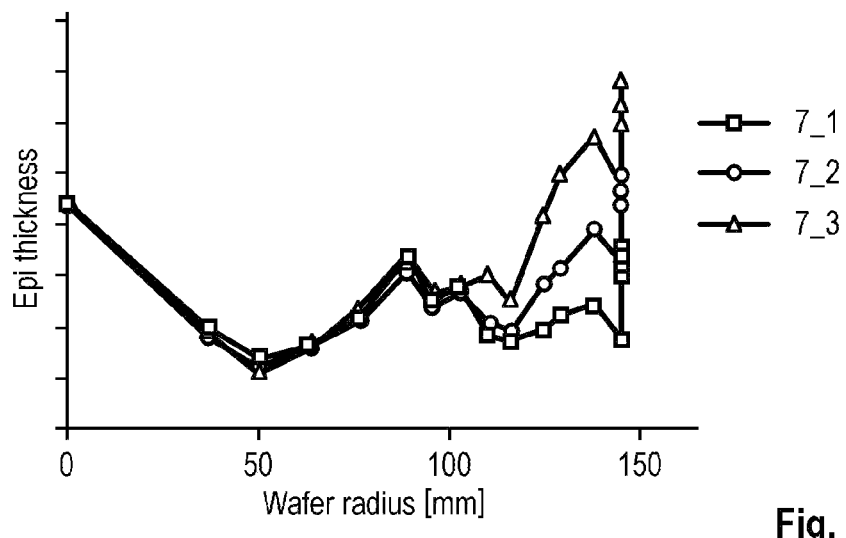
FIG. 7 is a diagram illustrating the radial thickness distribution (i.e. layer thickness in arbitrary units versus wafer radius in mm) of epitaxial layers formed on the substrate by using a blade-shaped process gas deflector shaped as a ring segment extending above the gas inlet and having a recess (cutout) in the exhaust area, with different process parameters concerning the flow rate of an auxiliary process gas flow delivered by a side process gas inlet to the substrate.

FIG. 7 illustrates the radial thickness distribution of epitaxial layers formed in the processing chamber 100 with a process gas flow deflector 310 above the process gas inlet 130 and a recess (i.e. cutout) in the exhaust area, i.e. above the process gas outlet 150. Different process parameters concerning the flow rate of an auxiliary process gas flow (X-flow) delivered by the side process gas inlet 130_1 were used. More specifically, for a given main flow rate, the curves 7_1, 7_2, 7_3 correspond to the following process tuning parameters:

curve 7_1: X-flow, flow rate=90%
curve 7_2: X-flow, flow rate=100%
curve 7_3: X-flow, flow rate=110%.

FIG. 7 shows that layer thickness adjustment via X-flow control is again possible when using a recessed process gas flow deflector 310 in which the deflector part is shaped as a ring segment which does not overlay the exhaust. The more X-flow, the higher is the layer thickness at the edge. FIG. 7 shows 4 measured values per each curve 7_1, 7_2, 7_3 directly at the edge radius, otherwise only one measured value at each radius per curve 7_1, 7_2, 7_3.

Figure 8:
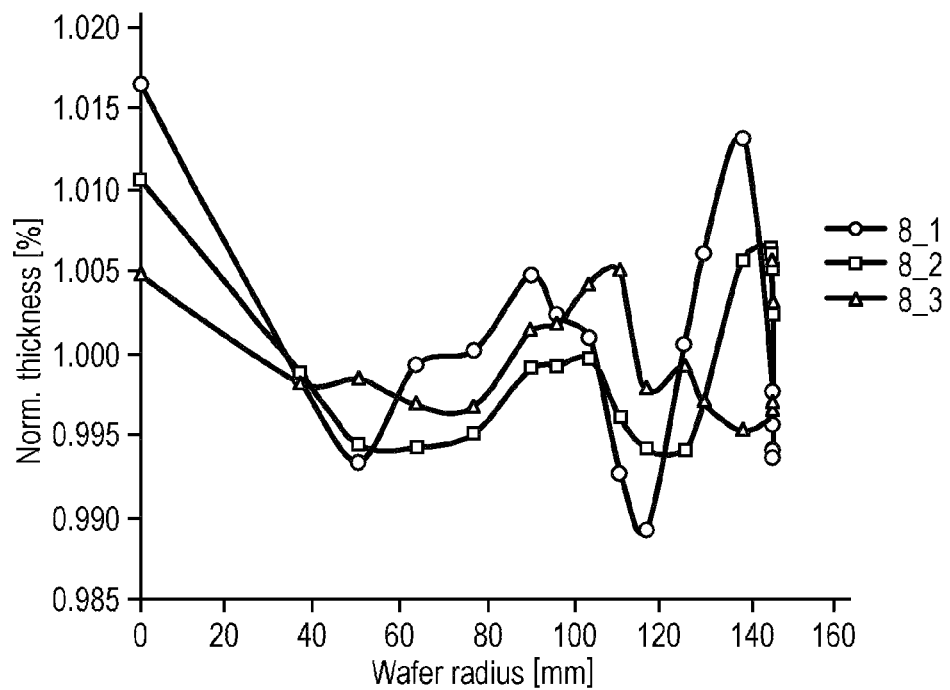
FIG. 8 is a diagram illustrating the normalized radial thickness distribution (i.e. normalized layer thickness in % versus wafer radius in mm) of epitaxial layers formed on the substrate by using a blade-shaped process gas deflector shaped as a ring segment extending above the gas inlet and having a recess (cutout) in the exhaust area and by using no process gas deflector.

FIG. 8 shows that with the recessed process gas flow deflector 310 a high uniformity of the thickness profile can be achieved. The curves 8_1 and 8_2 were obtained without any process gas flow deflector, i.e. with the standard liner used in the standard processing chamber 100 of the AMAT Epi Centura equipment. Greater thickness variations were always observed with different process tuning parameters (curves 8_1 and 8_2). Curve 8_3 was obtained when using the recessed process gas flow deflector 310 as disclosed herein (FIGS. 3A, 3B, 9A, 9B). This recessed process gas flow deflector 310 enables a smoothing of the thickness profile over the entire wafer, with a maximum normalized thickness variation of ±0.005%.

In other words, it has been found that channeling the process gas inlet stream at the process gas inlet 130, in combination with not channeling the process gas exhaust stream at the process gas outlet 150, induces flow conditions in the processing chamber 100 that result in a highly uniform and readily controllable layer deposition.

Figure 9A:
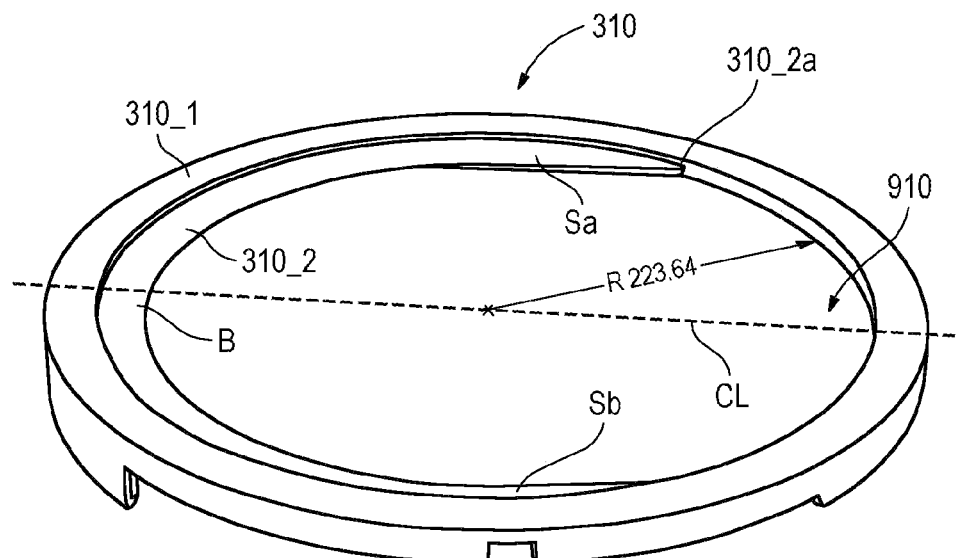
FIG. 9A is a perspective illustration of an exemplary process gas flow deflector having a radially inner blade-shaped process gas deflection portion which is configured to overlay the process gas inlet of the processing chamber and has a cutout at the process gas outlet of the processing chamber.
Figure 9B:
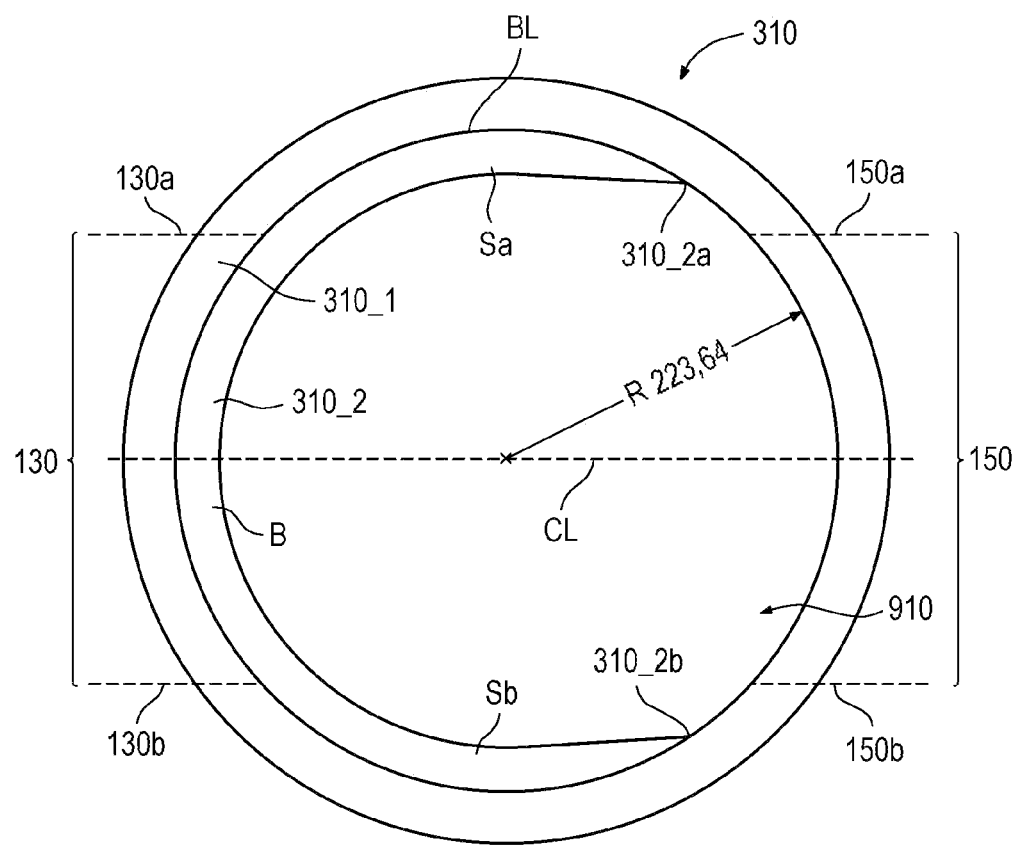
FIG. 9B is a top view of the exemplary process gas flow deflector of FIG. 9A.

FIGS. 9A and 9B illustrate an exemplary process gas flow deflector 310. This process flow deflector 310 was used at the experimental setups for measuring the curves 7_1, 7_2, 7_3 and 8_3 of FIGS. 7 and 8, respectively.

The process gas flow deflector 310 includes the radially outer mounting portion 310_1 and the radially inner blade-shaped process gas deflection portion 310_2, see also FIGS. 3A and 3B. The radially inner blade-shaped process gas deflection portion 310_2 extends in the circumferential direction to end at ends 310_2a and 310_2b. Hence, the radially inner blade-shaped process gas deflector 310_2 is shaped as a ring segment, wherein the ends 310_2a and 310_2b define the borders of a cutout 910 or recess of the process gas flow deflector 310.

The cutout 910 located between the ends 310_2a and 310_2b of the blade-shaped process gas deflection portion 310_2 may be sized in its circumferential direction to completely overlay the process gas outlet 150 in terms of its lateral dimensions, which are illustrated in FIG. 9B by dashed lines 150a, 150b corresponding to the outline of the process gas outlet 150. The cutout 910 may be sized in its radial direction to completely or nearly completely overlay (i.e., expose in a vertical projection) the preheat ring 140 at the process gas outlet 150. Further, as mentioned previously, the radially inner blade-shaped process gas deflection portion 310_2 completely overlays the process gas inlet 130, with the outlines 130a, 130b of the process gas inlet 130 indicated by dashed lines in FIG. 9B.

The radially inner blade-shaped process gas deflection portion 310_2 may comprise or be composed of a base ring segment section B and two side ring segment sections Sa, Sb adjoining the base ring segment section B and extending in the circumferential direction to the cutout 910, i.e. to their ends 310_2a and 310_2b, respectively. While the base ring segment section B may have a radially constant dimension, the side ring segment sections Sa, Sb each have a shape tapering radially towards the cutout 910 and ending at the cutout at the ends 310_2a, 310_2b, respectively. The base ring segment section B may extend in a circumferential direction over an angular range of equal to or greater than 140° or 160° or 180° or 200°. The cutout 910 may extend in a circumferential direction over an angular range of equal to or greater than 90° or 110° or 130° or 150°. The (optional) two side ring segment sections Sa, Sb may be sized to fill the residual angular range between the base ring segment section B and the cutout 910.

The blade-shaped process gas deflection portion 310_2 may be sized to overlay the side process gas inlet 130_1. For instance, the side ring segment section Sa may be positioned to overlay the side process gas inlet 130_1.

In the example shown, the inner periphery of the side ring segment sections Sa, Sb are linear. For example, they may be tangential to the inner radius of the base ring segment B. In other examples, the inner periphery of the side ring segment sections Sa, Sb may have a curved shape. For example, the curve can be concave or convex, i.e. may enlarge the angular extension of the side ring segments Sa, Sb or may reduce it compared to a tangential periphery line.

The process gas flow deflector 310 may be symmetrical to the center line CL of the process gas inlet 130 (which may coincide with the center line of the process gas outlet 150).

As apparent from FIG. 3B, the mounting portion 310_1 of the process gas flow deflector 310 may not overlap with the pre-heat ring 140. Therefore, within the cutout 910 along the process gas outlet 150, the pre-heat ring 140 may be completely exposed in a vertical projection by the process gas flow deflector 310.

In the example shown, the boundary line BL between the radially inner blade-shaped process gas deflection portion 310_2 and the radially outer mounting portion 310_1 has, e.g., a radius of 223.64 mm. This boundary line BL, however, does not have to be realized by a design feature (e.g., step at distance D4) of the process gas flow deflector 310, as exemplified in FIG. 3B, but results from the shape of the cutout 910 which requires that a radially inner part of the process gas flow deflector 310 be realized as a ring segment.

Differently stated, in an initial embodiment, the blade shaped process gas deflection portion 310_2, 410_2 was added to the so-called liner (FIG. 4: wall element 420; FIGS. 3A-B: integral mounting portion 310_1), with the blade shaped process gas deflection portion 310_2, 410_2 recessed at the process gas outlet 150. In other embodiments, the process gas flow deflector 310 with the cutout 910 at the process gas outlet 150 may be independent of the liner. Generally, only by means of a relatively small effort, the complete gas flow and the flow velocity in the processing chamber 100 can be changed by means of a single chamber part in order to obtain an improvement in the layer thickness and doping uniformity.

The following examples pertain to further aspects of the disclosure:

Example 1 is a processing chamber for processing a substrate comprises a chamber body defining an interior substrate processing region. The processing chamber comprises a substrate support for holding a substrate in place and a pre-heat ring having a central opening sized to be disposed around the substrate to be placed on the substrate support. A process gas inlet is configured to direct process gas in a lateral direction to flow over the pre-heat ring and over the substrate to be placed on the substrate support. A process gas outlet is arranged opposite the process gas inlet. A process gas flow deflector comprises a radially outer mounting portion and a radially inner blade-shaped process gas deflection portion extending in the radial direction. The radially inner blade-shaped process gas deflection portion is shaped as a ring segment. The radially inner blade-shaped process gas deflection portion is disposed above the process gas inlet and dimensioned to overlap with the pre-heat ring, wherein a degree of overlap between the pre-heat ring and the process gas flow deflector in the radial direction is at least ½ of the radial dimension of the pre-heat ring.

In Example 2, the subject matter of Example 1 can optionally include wherein the radially inner blade-shaped process gas deflection portion extends in the circumferential direction to end in a cutout at the process gas outlet.

In Example 3, the subject matter of Example 2 can optionally include wherein the radially inner blade-shaped process gas deflection portion comprises a base ring segment section overlaying the process gas inlet and two side ring segment sections adjoining the base ring segment section and extending in the circumferential direction to the cutout, the side ring segment sections each having a shape tapering radially towards the cutout and ending at the cutout.

In Example 4, the subject matter of Example 3 can optionally include wherein the base ring segment section has a constant radial dimension.

In Example 5, the subject matter of Example 3 or 4 can optionally include wherein the base ring segment section extends in a circumferential direction over an angular range of equal to or greater than 140° or 160° or 180° or 200°.

In Example 6, the subject matter of any of Examples 3 to 5 can optionally include wherein the cutout extends in a circumferential direction over an angular range of equal to or greater than 90° or 110° or 130° or 150°.

In Example 7, the subject matter of any preceding Example can optionally include wherein the processing chamber comprises a side process gas inlet configured to deliver an auxiliary process gas flow to the substrate, wherein the radially inner blade- shaped process gas deflection portion is disposed above and overlaying the side process gas inlet.

In Example 8, the subject matter of any preceding Example can optionally include wherein a distance in vertical direction between the radially inner blade-shaped process gas deflector portion and the pre-heat ring is equal to or less than 20 mm or 15 mm or 12 mm or 10 mm or 8 mm in proximity to the process gas inlet.

In Example 9, the subject matter of any preceding Example can optionally include wherein the degree of overlap is at least ⅔ or ¾ of the radial dimension of the pre-heat ring in proximity to the process gas inlet.

In Example 10, the subject matter of any preceding Example can optionally include wherein a degree of overlap in the radial direction is equal to or greater than 15 mm or 20 mm or 25 mm in proximity to the process gas inlet.

In Example 11, the subject matter of any preceding Example can optionally include wherein the process gas flow deflector is transparent for heat radiation.

In Example 12, the subject matter of any of Examples 1 to 10 can optionally include wherein the process gas flow deflector is non-transparent for heat radiation.

In Example 13, the subject matter of any preceding Example can optionally include wherein the radially outer mounting portion is formed as a closed ring.

In Example 14, the subject matter of Example 13 can optionally include wherein the radially outer mounting portion is configured to be permanently installed in a wall of the processing chamber.

In Example 15, the subject matter of Example 13 can optionally include wherein the radially outer mounting portion is configured to be hooked to a wall element of the processing chamber.

In Example 16, the subject matter of any preceding Example can optionally include wherein the central opening of the pre-heat ring is sized to separate the pre-heat ring from a periphery of the substrate support by a gap between 0.1 mm and 0.8 mm.

In Example 17, the subject matter of any preceding Example can optionally include wherein the substrate support is rotatable.

Example 18 is an example of a process gas flow deflector for use in a substrate processing chamber, the process gas flow deflector comprising a radially outer mounting portion; and a radially inner blade-shaped process gas deflection portion shaped as a ring segment and extending from the radially outer mounting portion in the radial inner direction over a distance of equal to or greater than 15 mm or 20 mm or 25 mm.

In Example 19, the subject matter of Example 18 can optionally include wherein the radially inner blade-shaped process gas deflection portion extends in the circumferential direction to end in a cutout configured to be arranged at a process gas outlet of the substrate processing chamber.

In Example 20, the subject matter of Example 19 can optionally include wherein the radially inner blade-shaped process gas deflection portion comprises a base ring segment section sized to completely overlay the process gas inlet and two side ring segment sections adjoining the base ring segment section and extending in the circumferential direction to the cutout, the side ring segment sections each having a shape tapering radially towards the cutout and ending at the cutout.

In Example 21, the subject matter of Example 19 can optionally include wherein the base ring segment section has a constant radial dimension.

In Example 22, the subject matter of Example 20 or 21 can optionally include wherein the base ring segment section extends in a circumferential direction over an angular range of equal to or greater than 140° or 160° or 180° or 200°.

In Example 23, the subject matter of any of Examples 20 to 22 can optionally include wherein the cutout extends in a circumferential direction over an angular range of equal to or greater than 90° or 110° or 130° or 150°.

In Example 23, the subject matter of any of Examples 20 to 23 can optionally include wherein the radially outer mounting portion is formed as a closed ring.

In Example 25, the subject matter of any of Examples 18 to 24 can optionally include wherein the radially outer mounting portion is configured to be permanently installed in a wall of the processing chamber.

In Example 26, the subject matter of Example 25 can optionally include wherein the radially outer mounting portion comprises a radially outer vertical section and a radially inner horizontal section.

In Example 27, the subject matter of any of Examples 18 to 24 can optionally include wherein the radially outer mounting portion is configured to be hooked to a wall element of the processing chamber.

In Example 28, the subject matter of any of Examples 18 to 27 can optionally include wherein the radially inner blade-shaped process gas deflection portion is transparent for heat radiation.

In Example 29, the subject matter of any of Examples 18 to 27 can optionally include wherein the radially inner blade-shaped process gas deflection portion is non-transparent for heat radiation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A processing chamber for processing a substrate, comprising:
    a chamber body defining an interior substrate processing region;
    a substrate support configured to hold a substrate in place;
    a pre-heat ring having a central opening sized to be disposed around the substrate to be placed on the substrate support;
    a process gas inlet configured to direct process gas in a lateral direction to flow over the pre-heat ring and over the substrate to be placed on the substrate support;
    a process gas outlet arranged opposite the process gas inlet; and
    a process gas flow deflector comprising a radially outer mounting portion and a radially inner blade-shaped process gas deflection portion extending in a radial direction,
    wherein the radially inner blade-shaped process gas deflection portion is shaped as a ring segment, wherein the radially inner blade-shaped process gas deflection portion is disposed above the process gas inlet and dimensioned to overlap with the pre-heat ring,
wherein a degree of overlap between the pre-heat ring and the process gas flow deflector in the radial direction is at least ½ of a radial dimension of the pre-heat ring,
wherein the radially inner blade-shaped process gas deflection portion is vertically spaced apart from the pre-heat ring such that a channel is delimited by a bottom surface of the radially inner blade-shaped process gas deflection portion and a top surface of the pre-heat ring, and
wherein the channel is configured to guide the process gas from the process gas inlet over the pre-heat ring in the radial direction towards the substrate support.

2. The processing chamber of claim 1, wherein the radially inner blade-shaped process gas deflection portion extends in a circumferential direction to end in a cutout at the process gas outlet.

3. The processing chamber of claim 2, wherein the radially inner blade-shaped process gas deflection portion comprises a base ring segment section overlaying the process gas inlet and two side ring segment sections adjoining the base ring segment section and extending in the circumferential direction to the cutout, the two side ring segment sections each having a shape tapering radially towards the cutout and ending at the cutout.

4. The processing chamber of claim 3, wherein the base ring segment section has a constant radial dimension.

5. The processing chamber of claim 3, wherein the base ring segment section extends in the circumferential direction over an angular range of equal to or greater than 140° or 160° or 180° or 200°.

6. The processing chamber of claim 3, wherein the cutout extends in the circumferential direction over an angular range of equal to or greater than 90° or 110° or 130° or 150°.

7. The processing chamber of claim 1, further comprising a side process gas inlet configured to deliver an auxiliary process gas flow to the substrate, wherein the radially inner blade-shaped process gas deflection portion is disposed above and overlaying the side process gas inlet.

8. The processing chamber of claim 1, wherein a distance in a vertical direction between the radially inner blade-shaped process gas deflector portion and the pre-heat ring is equal to or less than 20 mm or 15 mm or 12 mm or 10 mm or 8 mm in proximity to the process gas inlet.

9. The processing chamber of claim 1, wherein the degree of overlap is at least ⅔ or ¾ of the radial dimension of the pre-heat ring in proximity to the process gas inlet.

10. The processing chamber of claim 1, wherein the degree of overlap in the radial direction is equal to or greater than 15 mm or 20 mm or 25 mm in proximity to the process gas inlet.

11. The processing chamber of claim 1, wherein the process gas flow deflector is transparent for heat radiation.

12. The processing chamber of claim 1, wherein the process gas flow deflector is non-transparent for heat radiation.

13. The processing chamber of claim 1, wherein the radially outer mounting portion is formed as a closed ring.

14. The processing chamber of claim 13, wherein the radially outer mounting portion is configured to be hooked to a wall element of the processing chamber.

15. The processing chamber of claim 1, wherein the central opening of the pre-heat ring is sized to separate the pre-heat ring from a periphery of the substrate support by a gap between 0.1 mm and 0.8 mm.

16. The processing chamber of claim 1, wherein the substrate support is rotatable.

17. The processing chamber of claim 1, wherein a thickness of the radially inner blade-shaped process gas deflection portion decreases in the radial inner direction such that the radially inner blade-shaped process gas deflection portion has a tapered cross-section in the radial direction.

18. A process gas flow deflector for use in a substrate processing chamber, the process gas flow deflector comprising:
a radially outer mounting portion; and
a radially inner blade-shaped process gas deflection portion shaped as a ring segment and extending from the radially outer mounting portion in a radial inner direction over a distance of equal to or greater than 15 mm or 20 mm or 25 mm,
wherein a thickness of the radially inner blade-shaped process gas deflection portion decreases in the radial inner direction such that the radially inner blade-shaped process gas deflection portion has a tapered cross-section in the radial inner direction.

19. The process gas flow deflector of claim 18, wherein the radially inner blade-shaped process gas deflection portion extends in a circumferential direction to end in a cutout configured to be arranged at a process gas outlet of the substrate processing chamber.

20. The process gas flow deflector of claim 19, wherein the radially inner blade-shaped process gas deflection portion comprises a base ring segment section sized to completely overlay a process gas inlet of the substrate processing chamber and two side ring segment sections adjoining the base ring segment section and extending in the circumferential direction to the cutout, the two side ring segment sections each having a shape tapering radially towards the cutout and ending at the cutout.

21. The process gas flow deflector of claim 20, wherein the base ring segment section has a constant radial dimension.

22. The process gas flow deflector of claim 20, wherein the base ring segment section extends in the circumferential direction over an angular range of equal to or greater than 140° or 160° or 180° or 200°.

23. The process gas flow deflector of claim 20, wherein the cutout extends in the circumferential direction over an angular range of equal to or greater than 90° or 110° or 130° or 150°.

24. The process gas flow deflector of claim 18, wherein the radially outer mounting portion is formed as a closed ring.

25. The process gas flow deflector of claim 18, wherein the radially outer mounting portion comprises a radially outer vertical section and a radially inner horizontal section.

26. The process gas flow deflector of claim 18, wherein the radially outer mounting portion is configured to be hooked to a wall element of the substrate processing chamber.

27. The process gas flow deflector of claim 18, wherein the radially inner blade-shaped process gas deflection portion is transparent for heat radiation.

28. The process gas flow deflector of claim 18, wherein the radially inner blade-shaped process gas deflection portion is non-transparent for heat radiation.

* * * * *